United States Patent [19]

Zoroglu

[11] 3,784,884

[45] Jan. 8, 1974

[54] LOW PARASITIC MICROWAVE PACKAGE

[75] Inventor: Demir S. Zoroglu, Phoenix, Ariz.

[73] Assignee: Motorola, Inc., Franklin Park, Ill.

[22] Filed: Nov. 3, 1972

[21] Appl. No.: 303,466

[52] U.S. Cl. .......................... 317/234 R, 317/234 G
[51] Int. Cl. ............................................. H01l 5/00
[58] Field of Search .............................. 317/234, 5.4

[56] References Cited

UNITED STATES PATENTS

| | | | |
|---|---|---|---|
| 3,683,241 | 8/1972 | Duncan | 317/234 |
| 3,641,398 | 2/1972 | Fitzgerald | 317/234 |
| 3,626,259 | 12/1971 | Garboushian et al. | 317/234 |
| 3,698,082 | 10/1972 | Hyltin et al. | 29/624 |

*Primary Examiner*—John S. Heyman
*Assistant Examiner*—E. Wojciechowicz
*Attorney*—Vincent Rauner and Henry T. Olsen

[57] ABSTRACT

A low parasitic microwave transistor package is provided with a pair of parallel rectangular bonding rails extending from the metal header. A first insulating body having a metal film thereon is positioned closely between the two rails and is attached to the header. A microwave transistor die may be attached to the metal film on the insulating body. A second insulating body having an aperture therein is attached to the metal base, the aperture accommodating the two bonding rails and the first insulating body positioned therebetween. The alumina disk has two metal bonding pads formed thereon. A very low inductance, low resistance connection from the emitter of a transistor to the metal base may be provided by means of a plurality of parallel stitch bonds from the emitter bonding pads on the transistor die to the bonding rails. Balanced feeding may be provided to the emitter, base and collector.

14 Claims, 2 Drawing Figures

LOW PARASITIC MICROWAVE PACKAGE

BACKGROUND OF THE INVENTION

1. Field of the Invention

This invention relates to microwave transistor packages having very low parasitic inductance and capacitances associated with the leads thereof.

2. Description of the Prior Art

At microwave frequencies, the parasitic inductances and capacitances associated with the leads of semiconductor packages limit the gain and bandwidth of the transistors housed therein. Parasitic inductances and capacitances associated with microwave transistor packages may also cause other problems in circuits, such as parasitic or spurious oscillations which may arise when such devices are used at very high frequencies. The critical inductive parasitic components in a microwave transitor package are the inductance of the input terminal and the inductance of the terminal connected to ground. The inductance of the terminal connected to ground may be particularly critical, because it is inaccessible, and cannot be tuned out with additional external components. The critical capacitive parasitic component in a microwave transistor package is the feedback capacitance from the output terminal to the input terminal; it cannot be tuned out with external components. In most microwave transistor applications, it is required that the emitter or base of the transistor (rather than the collector) be connected to ground. However, the collector connection must provide a low thermal impedance to a heat sink to conduct heat dissipated in the transistor away from the PN junctions thereof. This requirement has led to the development of various packaging techniques, usually involving bonding to lead terminals at different heights, and involving a plurality of electrically conductive members and electrically insulative members bonded together. Low thermal impedance from the semiconductor die to the metal base is usually achieved by use of beryllia (BeO) disks having metal collector bonding pads formed thereon, to which the semiconductor die is subsequently attached. In the prior art packages, apertures are provided through the beryllia disk. Bonding posts from base, or header have been extended through the apertures in the beryllia disks to provide a low inductance connection to the semiconductor die. However, the manufacture of beryllia disks having apertures therein is extremely difficult, and therefore their cost is unacceptably high for many applications. Packages of this type generally suffer from an economic manufacturability problem due to their complex construction. In particular, the cost of prior art semiconductor packages for use at such frequencies is very high because of the expensive specially shaped ceramic beryllia disks required and the multiple layer construction of the metal headers and the package leads and the insulators therebetween. The present invention substantially solves the aforementioned problems of the prior art by providing a microwave semiconductor package having lower parasitic components and improved manufacturability.

SUMMARY OF THE INVENTION

It is an object of this invention to provide a low parasitic microwave transistor package having improved construction and reduced manufacturing costs.

Another object of this invention is to provide a microwave package of the type described wherein the emitter lead inductance is minimized by providing split emitter bonding rails extending from the header on opposite sides of the semiconductor chip to approximately the level of the semiconductor chip.

Another object of this invention is to provide a microwave package of the type described wherein a low thermal resistance between the semiconductor die and the header is provided by a metallized ceramic disk having the semiconductor die attached thereto positioned between the bonding posts, said metallized ceramic disk having no apertures therein.

Briefly described, the invention is a microwave package including a header (i.e., base) having a pair of parallel bonding rails extending from the upper surface of the header. Between the two bonding rails, a beryllia rectangular insulator is attached to the header to provide a low thermal resistance from the semiconductor die to the header. The exposed surface of the beryllia insulator has a metal collector bonding pad formed thereon. A semiconductor die may be attached to the metal collector bonding pad. The height of the bonding rails is approximately equal to the thickness of the beryllia insulator, to facilitate the attachment of bonding wires to the bonding rails, and further to reduce the inductance and resistance of the bonding wires. An alumina insulator having a rectangular aperture therein is attached to the header so that the two bonding rails and the beryllia insulator extend upward through said aperture. The alumina disk has two metal lead members, a base lead member and a collector lead member, formed thereon. A plurality of wire bonds may be provided from the emitter bonding pads on the semiconductor die extending symmetrically in opposite directions to the two bonding posts to provide minimum length, low inductance connections thereto. A plurality of parallel wire bonds may be provided for connecting the collector bonding pad on the beryllia insulator to the collector lead member on the alumina insulator to provide a low impedance uniform current path from the collector lead through the collector bonding pad to the collector of the semiconductor die. Similarly, a plurality of parallel wire bonds from the base bonding pads on a semiconductor die to the base lead member on the alumina insulator provide a relatively low impedance connection between the base lead of the package and the base electrode of the semiconductor die. A suitable hermetic seal may be provided on the microwave package.

DESCRIPTION OF THE INVENTION

Figure 1:
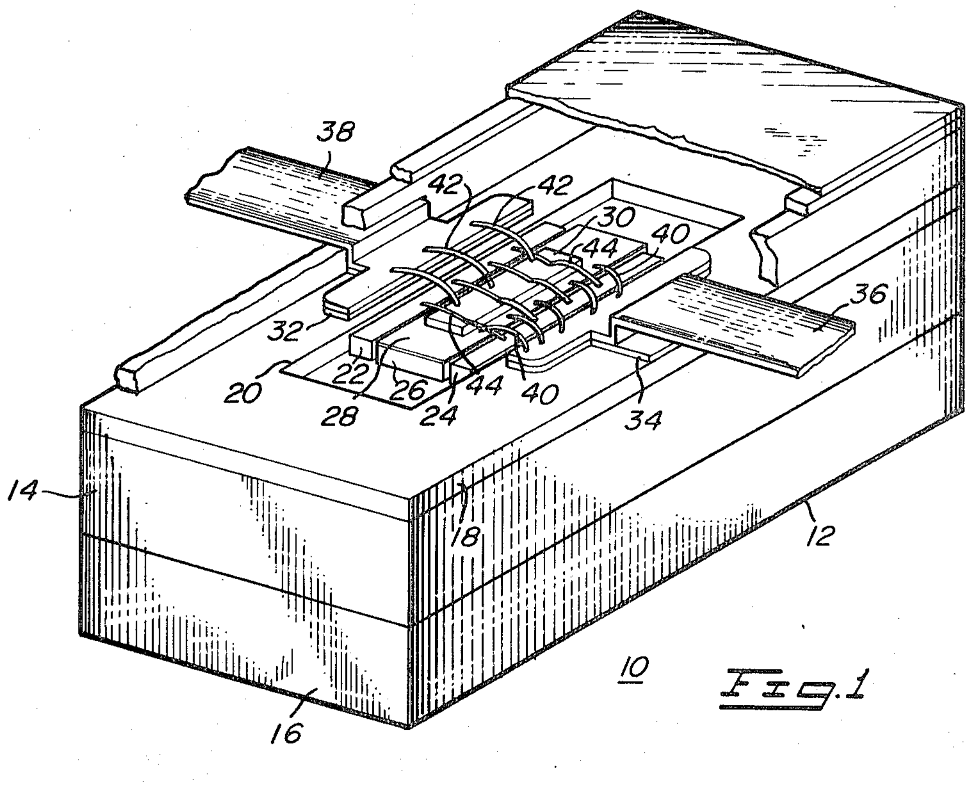
FIG. 1 is a profile diagram of the preferred embodiment of the invention.

In accordance with the invention, the microwave package 10, shown in FIG. 1, 1 includes a header, (base member) 14. Two parallel, rectangular bonding rails 22 and 24 extend from header 14. A ceramic insulator 18 has a rectangular aperture 20 therein, and is attached to header 14. Bonding rails 22 and 24 are accommodated within aperture 20. Thermally conductive ceramic insulator 26 is brazed to silver header 14 between bonding rails 22 and 24. A metal film 28 is formed on the exposed surface of insulator 26. A microwave transistor die 30 may be attached to metal film 28. Metal regions 32 and 34 are formed on the upper surface of alumina disk 18 on opposite sides of aperture 20. Metal lead member 36 is formed on metal region 34 and extends laterally outward from microwave package 10. Metal lead member 38 is formed on metal region 32 and also extends outward from microwave package 10.

Figure 2:
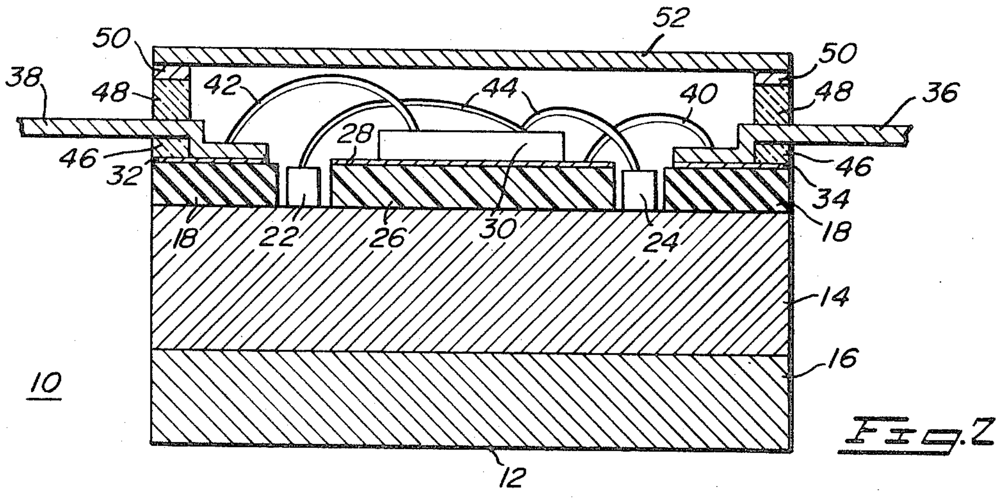
FIG. 2 is a cross-sectional view of the drawing in FIG. 1, additionally depicting the hermetic sealing features of the invention.

In a preferred embodiment of the invention, header 14 is formed from a coinable metal, preferably silver, and is attached to base member 16, which may be formed from a different metal, such as copper. Base member 16 may, for example, include a threaded stud for conveniently mounting microwave package 10 on a chassis. For other applications, such as a strip line assembly, base member 16 may be omitted. The two parallel, rectangular bonding rails 22 and 24 are coined from silver header 14. The rectangular ceramic insulator 18 is alumina, and is brazed to the silver header 14. It should be recognized that in certain instances two separate alumina insulators, each positioned adjacent to a separate bonding rail, may be advantageously utilized in place of single alumina insulator 18. Thermally conductive ceramic insulator 26 is beryllia, and is brazed to silver header 14 between bonding rails 22 and 24. Microwave transistor die 30 may be attached by known die bonding methods to metal film 28. As illustrated in FIG. 1, a plurality of collector bonding wires 40 may be bonded to collector lead member 36 and also to collector bonding pad 28. A plurality of parallel base bonding wires 42 may be bonded to the base electrode of transistor 30 and also to metal base lead member 38. A plurality of spaced parallel bonding wires 44 are stitch bonded, to bonding rail 22, and to emitter electrode of transistor 30, and also to bonding rail 24. It should be recognized that the utilization of the split bonding rails 22 and 24 having height approximately equal to the thickness of beryllia insulator 26 permits use of minimum lengths of wire to provide bonding wires 44, thereby minimizing the inductance thereof, and also facilitating the wire bonding procedure. The preferred arrangement for providing a hermetic seal for microwave package 10 is illustrated in FIG. 2. A glass sealing ring 46 is fuzed to metallization layers 32 and 34, and to external lead members 36 and 38, and also to alumina insulator 18. A second glass sealing ring 48 is fuzed to metal ring 50, to lead frame members 36 and 38, and also to lower glass ring 46. A metal lid 52 is then electro-welded to metal ring 50. The feedback capacitance of microwave package 10 is extremely low, since there is no physical overlap between the base terminal 38 and the collector terminal 36. If the transistor is to be used in the common base configuration, the base rather than the emitter electrode of the transistor die 30 is stitch bonded to the bonding rails 22 and 24, and the feedback capacitance will remain extremely low. Stitch bonding is a method of wire bonding wherein a single length of bonding wire is bonded consecutively at at least three different points. In microwave package 10, the emitter bonding leads 44 are stitch bonded to form a dipole, to reduce the inductance therof. However, the emitter bonding leads 44 may also be stitch bonded from a point on one bonding rail to the emitter bonding pad on the transistor die 30 back to an adjacent point on the same bonding rail; the next stitch bond may then connect the next emitter bonding pad to the opposite bonding rail in the same manner. The inductances associated with the two methods of stitch bonding to the bonding rails is essentially equal. A microwave package having a header measuring 155 mils by 300 mils has been constructed. The measured feedback capacitance (collector to base) thereof is 0.012 picofarads, and the measured input inductance (i.e., base lead inductance) is 0.1 nanohenrys, and the measured ground inductance (i.e., emitter lead inductance) is 0.05 nanohenrys. "Balanced feeding" is used to provide uniform impedance at microwave frequencies from each terminal to all points of the corresponding electrode of the transistor die 30. Balanced feeding refers to the relative lengths of the wire bonds going from a lead to the spaced bonding pads of a single electrode on the chip. If the wire bonds for an electrode are symmetrically positioned and equal in length, the requirements of balanced feeding are met. If these wire bonds are greatly different in length, the inductances thereof will also differ greatly. Thus, much more energy will be transmitted to the portion of the transistor electrode bonded to the shorter leads than the portion bonded to the longer leads. Since much more current normally flows through the emitter of a transistor than through its base, balanced feeding is usually more important for the emitter lead. This is because a greater difference in voltage drop across the different impedances of the imbalanced emitter bonding leads will result at higher currents than at lower currents, and the resulting non-uniform emitter-to-base forward bias voltage causes inefficient operation of the transistor. However, for optimum performance, both the emitter and base wire bonding should be balanced. The collector wire bonding wires should also be balanced. The effect of imbalanced impedance of the collector bonding wires has not been clearly determined. However, experiments have shown that feeding a collector bonding pad such as collector bonding pad 28 in FIG. 1 from one side only is very detrimental to performance at high frequencies if the current is high. Thus, the high frequency power gain is seriously degraded. It is thought that imbalanced collector bonding can result in microwave energy being reflected from the imbalanced collector bonding region back to the transistor die, resulting in inefficient utilization of the collector area, and non-uniform power dissipation thereat. It has been determined that negligible capacitive coupling and mutual inductive coupling occurs between bonding wires of different terminals when the parallel wires are spaced approximately 5 mils apart.

In summary, the present invention provides an easily manufacturable microwave transistor package having much smaller parasitic components of feedback capacitance, ground inductance, and input inductance than any prior art package, of comparable cost thereby also providing suitable operation of microwave transistors therein at higher frequencies than any prior art package of comparable cost. The low values of the prior described parasitic elements and the relatively low manufacturing costs of the present invention result directly from the unique combination of two parallel bonding posts coined from the header, a metallized beryllia disk, an apertured metallized alumina disk, metal lead members, and balanced feeding from the transistor due to the lead members and the two bonding posts to produce a package having essentially single layer construction on the header. It should be apparent to persons skilled in the art that microwave package 10 may be advantageously used for a microwave field-effect transistor, wherein the bonding rails are utilized for the ground lead.

While this invention has been shown in connection with several specific examples, it will be readily apparent to those skilled in the art that various changes in form and arrangement of parts may be made to suit specific requirments without department from the spirit and scope of the present invention.

What is claimed is:

1. A low parasitic package comprising:
 a metal header;
 a first bonding rail extending directly from a surface of said metal header;
 a first thermally conductive insulator attached to said metal header adjacent to said first bonding rail, said first insulator having a metal film on a major surface thereof, said first thermally conductive insulator having no openings therein;
 a second insulator attached to said metal header adjacent to said first bonding rail, said second insulator having an opening therein exposing said surface, said first thermally conductive insulator and said first bonding rail being within said opening, said second insulator having first and second metal regions thereon; and,
 first and second metal lead members connected, respectively, to said first and second metal regions and extending externally of the package.

2. The low parasitic package as recited in claim 1 further including a second bonding rail extending directly from said surface of said metal header within said opening and parallel to said first bonding rail and to said surface of said metal header, said first insulator being positioned between said first and second bonding rails.

3. The low parasitic package as recited in claim 2 wherein said first and second bonding rails are integral with said metal header.

4. The low parasitic package as recited in claim 1 wherein said first insulator is beryllia.

5. The low parasitic package as recited in claim 1 wherein said second insulator is alumina.

6. A low parasitic package for a semiconductor die comprising:
 a metal header;
 first and second bonding rails extending from a surface of said metal header;
 a first metallized thermally conductive insulator attached to said metal header adjacent to said first bonding rail and having the semiconductor die attached to said first metallized insulator, said first metallized insulator being positioned between said first and second bonding rails;
 a second metallized insulator attached to said metal header adjacent to said first bonding rail, said second metallized insulator having an opening therein exposing said surface, said first thermally conductive insulator in said first bonding rail being within said opening;
 a first dipole wire bond lead connecting a first electrode of the semiconductor die to said first and second bonding rails and
 a first metal lead member formed on a first metallized region of said second metallized insulator;
 a second wire bond lead connecting a first metallized region of said first metallized insulator to said first metal lead member;
 a second metal lead member formed on a second metallized region of said second metallized insulator; and,
 a third wire bond lead connecting a second electrode of said semiconductor die to said second metallized region.

7. The low parasitic package as recited in claim 6 wherein said first and second bonding rails are integral with said metal header.

8. The low parasitic package as recited in claim 6 wherein said first metallized insulator is beryllia.

9. The low parasitic package as recited in claim 6 wherein said second metallized insulator is alumina.

10. The low parasitic package as recited in claim 6 wherein the first electrode of the semiconductor die is its emitter and the second electrode thereof is its base.

11. The low parasitic package as recited in claim 6 including a plurality of stitch wire bonding leads connecting the first electrode of the semiconductor die to said first and second bonding rails for producing a balanced low inductance connection between the first electrode of the semiconductor die and said metal header.

12. The low parasitic package as recited in claim 6 further including a plurality of wire bonding leads connecting the metallized region of said first metallized insulator to the first metal lead member.

13. The low parasitic package as recited in claim 6 further including a plurality of wire bonding leads connecting the second electrode of the transistor to the second metal lead member.

14. A low parasitic microwave transistor package comprising:
 a rectangular silver header;
 first and second bonding rails extending from and integral with a surface of said silver header, said first and second bonding rails being parallel;
 a rectangular beryllia insulator brazed to said silver header at said surface between said first and second bonding rails, the exposed major surface of said beryllia insulator being metallized, and having the microwave transistor attached thereto;
 a rectangular alumina insulator having a rectangular aperture therein, said first and second bonding rails and said rectangular beryllia insulator being within said rectangular opening;
 first and second metallized regions on a surface of said rectangular alumina insulator, on opposite sides of said aperture in said rectangular alum-na insulator;
 first and second metal lead members formed, respectively, on said first and second metallized regions;
 a plurality of parallel stitch wire bonding leads connected between the emitter electrode of the microwave transistor and said first and second bonding posts;
 a plurality of parallel wire bonding leads connecting said first metal lead member to the base lead of the microwave transistor; and
 a plurality of parallel wire bonding leads connecting the collector of said microwave transistor to said second metal lead member.

* * * * *